United States Patent
Matsukawa et al.

(10) Patent No.: US 7,791,519 B2
(45) Date of Patent: Sep. 7, 2010

(54) SEMICONDUCTOR DEVICE, SEMICONDUCTOR DEVICE TESTING APPARATUS, AND SEMICONDUCTOR DEVICE TESTING METHOD

(75) Inventors: Kazuo Matsukawa, Osaka (JP); Mitsutoshi Fujita, Kyoto (JP)

(73) Assignee: Panasonic Corporation, Osaka (JP)

( * ) Notice: Subject to any disclaimer, the term of this patent is extended or adjusted under 35 U.S.C. 154(b) by 58 days.

(21) Appl. No.: 12/293,910

(22) PCT Filed: Mar. 22, 2007

(86) PCT No.: PCT/JP2007/055796
§ 371 (c)(1),
(2), (4) Date: Sep. 22, 2008

(87) PCT Pub. No.: WO2007/122950
PCT Pub. Date: Nov. 1, 2007

(65) Prior Publication Data
US 2009/0128382 A1    May 21, 2009

(30) Foreign Application Priority Data
Mar. 23, 2006    (JP)    ............................... 2006-080656

(51) Int. Cl.
    *H03M 1/66*    (2006.01)
(52) U.S. Cl. ........................ 341/144; 341/120
(58) Field of Classification Search ................ 341/144, 341/141, 139, 143, 118, 120
See application file for complete search history.

(56) References Cited

U.S. PATENT DOCUMENTS

| | | | |
|---|---|---|---|
| 4,538,266 A * | 8/1985 | Miki | ............. 341/120 |
| 5,515,047 A | 5/1996 | Yamakido et al. | ............ 341/153 |
| 6,351,228 B1 | 2/2002 | Kutsuno et al. | ............. 341/120 |
| 6,408,412 B1 | 6/2002 | Rajsuman | .................... 714/724 |
| 6,535,011 B1 | 3/2003 | Sakaguchi | ................... 324/763 |
| 6,566,857 B1 * | 5/2003 | Kakizawa et al. | ........... 324/120 |
| 6,597,300 B2 | 7/2003 | Mori | .......................... 341/144 |
| 7,126,510 B2 * | 10/2006 | Alon et al. | ................... 341/120 |
| 2002/0005722 A1 | 1/2002 | Morita | ........................ 324/523 |

FOREIGN PATENT DOCUMENTS

| | | |
|---|---|---|
| JP | 61-16624 | 1/1986 |
| JP | 63-271179 | 11/1988 |
| JP | 63-299411 | 12/1988 |
| JP | 6-303137 | 10/1994 |
| JP | 2000-295102 | 10/2000 |
| JP | 2001-99900 | 4/2001 |
| JP | 2001-134458 | 5/2001 |
| JP | 2002-111495 | 4/2002 |

* cited by examiner

*Primary Examiner*—Brian Young
(74) *Attorney, Agent, or Firm*—Steptoe & Johnson LLP

(57) ABSTRACT

In a pass/fail judgment test for a semiconductor IC having plural DACs, there is a problem that the test time is undesirably increased due to an increase on the number of DACs or an increase in resolution.

When testing two DACs, i.e., DAC1 and DAC2, a control unit (170) alternately increases the digital input values of the DAC1 and DAC2, whereby the output of a comparator 1 to which the analog output values of the DAC1 and DAC2 are inputted repeats inversion between "0" and "1". It is judged whether the DACs are conforming or not by judging with a judgment unit (180) whether the output pattern of the comparator 1 matches an expected value or not.

11 Claims, 14 Drawing Sheets

SEMICONDUCTOR DEVICE, SEMICONDUCTOR DEVICE TESTING APPARATUS, AND SEMICONDUCTOR DEVICE TESTING METHOD

The present application is based on International Application PCT/JP2007/055796 filed Mar. 22, 2007, which claims priority of Japanese Patent Application No. 2006-080656, filed Mar. 23, 2006.

TECHNICAL FIELD

The present invention relates to a semiconductor device, a semiconductor device testing apparatus, and a semiconductor device testing method, and particularly, to a semiconductor device having digital-to-analog converters (hereinafter referred to as DACs), an apparatus for testing the semiconductor device, and a method for testing the semiconductor device, and more particularly, to those which can facilitate a test for a semiconductor device having plural DACs.

BACKGROUND ART

With the progress in semiconductor processes, it has become possible to mount plural DACs in the same semiconductor integrated circuit. In a test for such semiconductor integrated circuit having plural DACs, there is a tendency that the test time is increased as the number of the DACs mounted becomes larger or the resolution (resolution capability) thereof becomes higher.

Conventionally, as one of approaches to reduce the test time for the semiconductor integrated circuit of this type, there is a method of testing the outputs of the DACs using analog-to-digital converters (hereinafter referred to as ADCS). However, since the ADCs which are higher in precision than the DACs are required in the test for the high-resolution DACs, the circuit scale of the semiconductor integrated circuit having these DACs and ADCs is undesirably increased.

Besides, as disclosed in Patent Document 1 or Patent Document 2 which is a laid-open unexamined publication of Patent Document 1, there is a method of comparing three or more DACs using a comparator, and performing a judgment on the basis of the comparison result.

Patent Document 1: Japanese Published Examined Application No. Sho. 64-9771

Patent Document 2: Japanese Published Unexamined Application No. Sho. 61-16624

DISCLOSURE OF THE INVENTION

Problems to be Solved by the Invention

However, the conventional method disclosed in Patent Document 1 or Patent Document 2 is one for detecting whether or not a failure occurs in a system that is actually operating, i.e., a system that is normally operating, and this method does not provide a test method for judging whether a semiconductor integrated circuit before shipping is a conforming product or not.

That is, the conventional method disclosed in Patent Document 1 or Patent Document 2 requires three or more DACs, and it is based on the premise that the three or more DACs would not fail at the same time. Therefore, this conventional method is not suitable for the semiconductor IC test which is aimed at performing a pass/fail judgment before shipping.

Further, the conventional method disclosed in Patent Document 1 or Patent Document 2 is a method which repeats the operation of comparing an output of an odd-numbered DAC and an output of an even-numbered DAC among three or more DACs with a digital input value given to the odd-numbered DAC being fixed and a digital input value given to the even-numbered DAC being increased "1" by "1" successively from its minimum value to its maximum value, and thereafter, again comparing the outputs of the odd-numbered and even-numbered DACs with the digital input value given to the even-numbered DAC being increased "1" by "1" successively from its minimum value to its maximum value after the digital input value given to the odd-numbered DAC is increased by "1". Therefore, this conventional method is poor in the failure detection efficiency, and is not suitable for speed-up of the test.

The present invention is made to solve the above-described problems and has for its object to provide a semiconductor device having DACs, a semiconductor device testing apparatus, and a semiconductor device testing method, which realize speed-up of a test for a semiconductor IC having two or more DACs, or realize a test by a semiconductor IC alone.

Measures to Solve the Problems

In order to solve the above-described problems, according to Claim 1 of the present invention, there is provided a semiconductor device comprising: two or more digital-to-analog converters (hereinafter referred to as DACs); a setting unit which sets digital input values to be input to at least two DACs among the two or more DACs; a comparison unit which compares the magnitudes of analog output values outputted from the at least two DACs with each other, and outputs a comparison result; and, an offset correction unit which performs a correction that adds offsets to the analog values outputted from the DACs by adding the offsets to the analog output values outputted from the at least two DACs.

Further, according to Claim 2 of the present invention, in the semiconductor device defined in Claim 1, the setting unit comprises a memory in which a program is stored, and a CPU which controls the digital input values to be input to the at least two DACs in accordance with the program stored in the memory.

Further, according to Claim 3 of the present invention, the semiconductor device defined in Claim 1 further includes a judgment unit which judges whether the at least two DACs are conforming or not on the basis of the comparison result.

Further, according to Claim 4 of the present invention, the semiconductor device defined in Claim 1 further includes a pattern generation unit which generates a pattern for controlling the digital input values to be input to the at least two DACs.

Further, according to Claim 6 of the present invention, the semiconductor device defined in Claim 1 further includes an offset correction unit which performs a correction that adds offsets to the digital input values which are to be input to the at least two DACs.

Further, according to Claim 7 of the present invention, there is provided a semiconductor device testing apparatus which performs a pass/fail judgment for a semiconductor device having two or more DACs, comprising: a control unit which controls at least two DACs; a comparator which compares the magnitudes of analog output values outputted from the at least two DACs with each other; a judgment unit which judges whether the at least two DACs are conforming or not on the basis of the comparison result obtained by the comparison unit; the control unit performing a control of alternately one by one increasing or decreasing the digital input values to be input to the two DACs so that an output signal indicating the comparison result for the analog output values outputted from the two DACs has alternately inverted values.

Further, according to Claim 9 of the present invention, in the semiconductor device testing apparatus defined in Claim 7, the comparison unit comprises plural comparators which simultaneously compare the analog output values outputted from the plural pairs of the DACs with each other.

Further, according to Claim 10 of the present invention, in the semiconductor device testing apparatus defined in Claim 7, the comparison unit comprises plural comparators which simultaneously compare the magnitude of the analog output value outputted from one DAC among the at least two DACs with the magnitudes of the analog output values outputted from the remaining DACs.

Further, according to Claim 11 of the present invention, in the semiconductor device testing apparatus defined in Claim 7, the judgment unit judges whether the at least two DACs are conforming or not on the basis of whether the comparison result obtained by the comparison unit has a predetermined pattern comprising alternately inverted values or not.

Further, according to Claim 10 of the present invention, there is provided a method for testing a semiconductor device having two or more DACs, comprising: a control step of controlling the operations of arbitrary two DACs among the two or more DACs; a comparison step of comparing the magnitudes of analog output values outputted from the arbitrary two DACs with each other; a judgment step of judging whether the arbitrary two DACs are conforming or not on the basis of the comparison result obtained in the comparison step; the control step performing a control of alternately one by one increasing or decreasing the digital input values to be input to the two DACs so that an output signal indicating the comparison result for the analog output values outputted from the two DACs has alternately inverted values.

Further, according to Claim 11 of the present invention, there is provided a method for testing a semiconductor device having two or more DACs, comprising: a control step of controlling the operations of arbitrary two DACs among the two or more DACs; a comparison step of comparing the magnitudes of analog output values outputted from the arbitrary two DACs with each other; a judgment step of judging whether the arbitrary two DACs are conforming or not on the basis of the comparison result obtained in the comparison step; and the judgment step judging whether the two DACs are conforming or not by judging whether the comparison result obtained in the comparison step has the alternately inverted values or not.

EFFECTS OF THE INVENTION

According to the present invention, a semiconductor device is provided with a control unit for setting the digital input values of arbitrary two DACs, comparison units each for comparing the magnitudes of the analog output values of the DACs whose digital values are set by the control unit, and a judgment unit for judging whether the DACs are conforming or not on the basis of the pattern of the comparison result outputted from each comparison unit, and the digital values of the respective DACs are controlled by the control unit so that the comparison result obtained by comparing the analog values of the paired DACs with each other by the comparison unit has alternately inverted values, and then it is judged by the judgment unit whether the DACs are conforming units or not on the basis of whether or not the pattern of the comparison result matches such an expected pattern that alternately repeats "0" and "1". Therefore, it is possible to judge whether the two DACs are conforming units or not by comparing the analog values of the two DACs and judging whether the pattern of the comparison result matches the expected pattern or not. Thus, the test for judging whether a semiconductor IC having two or more DACs is a conforming product or not can be speedily carried out with the small-scale additional circuit.

DESCRIPTION OF REFERENCE NUMERALS

Figure 1:
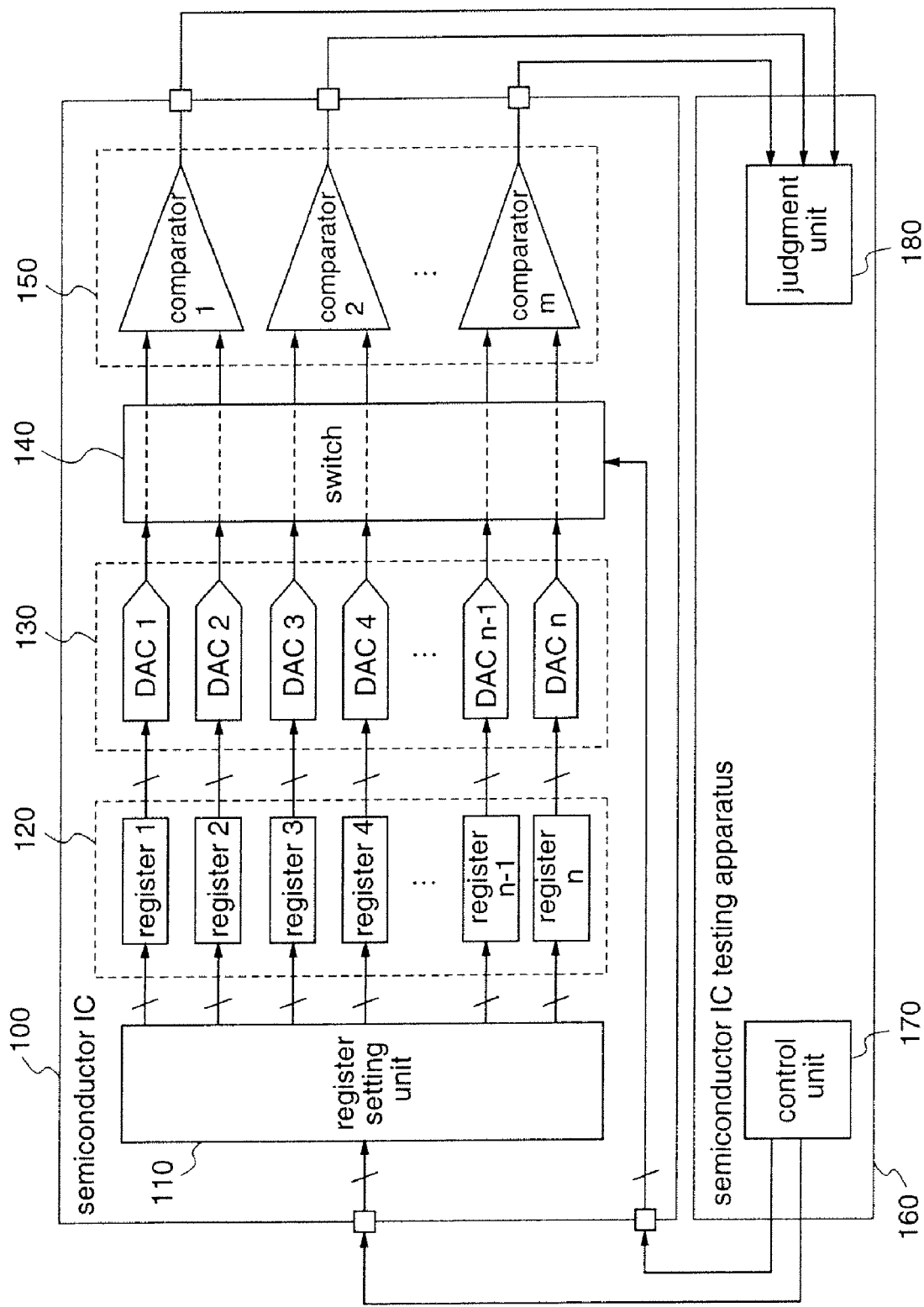
FIG. 1 is a diagram illustrating a construction when a semiconductor IC testing apparatus directly controls digital input values of DACs in a semiconductor IC.

100 ... semiconductor IC
110 ... selection unit
120 ... register unit
130 ... DAC unit
140 ... switch unit 150 . . . comparison unit
160 . . . semiconductor IC testing apparatus
170 . . . control unit
180 . . . judgment unit
701 . . . register initialization process
702 . . . DAC offset judgment process
703 . . . offset value detection process
704 . . . offset value setting process
800 . . . semiconductor IC
810 . . . CPU bus
811 . . . CPU
812 . . . memory
820 . . . register unit
830 . . . DAC unit
840 . . . switch unit
850 . . . comparison unit
860 . . . semiconductor IC testing apparatus
870 . . . control unit
880 . . . judgment unit
900 . . . semiconductor IC
910 . . . CPU bus
911 . . . CPU
912 . . . memory
920 . . . register unit
930 . . . DAC unit
940 . . . switch unit
950 . . . comparison unit
980 . . . result outputting register
1000 . . . semiconductor IC
1010 . . . CPU bus
1011 . . . CPU
1012 . . . memory
1013 . . . pattern generation unit
1015 . . . offset correction unit
1014 . . . control unit
1020 . . . register unit
1030 . . . DAC unit
1040 . . . switch unit
1050 . . . comparison unit
1080 . . . result outputting register

BEST MODE TO EXECUTE THE INVENTION

Hereinafter, embodiments of the present invention will be described with reference to the drawings.

Embodiment 1

FIG. 1 shows a semiconductor IC having digital-to-analog converters according to a first embodiment of the present invention.

With reference to FIG. 1, 100 denotes a semiconductor IC, 110 denotes a register setting unit, 120 denotes a register unit, 130 denotes a DAC unit, 140 denotes a switch unit, and 150 denotes a comparison unit. Further, 160 denotes a semiconductor IC testing apparatus, 170 denotes a control unit, and 180 denotes a judgment unit.

In this first embodiment, the semiconductor IC 100 includes the register setting unit 110, the register unit 120, the DAC unit 130, the switch unit 140, and the comparison unit 150.

The register setting unit 110 selects an arbitrary register in the register unit 120 and sets a register value thereof according to an external instruction. The register unit 120 comprises register 1 to register n (n=2 m; m is an integer not less than 1), and set digital input values to be input to the DAC unit 130.

The DAC unit 130 comprises DAC1 to DACn, and converts the respective digital input values into analog output values. The switch unit 140 connects arbitrary DACs constituting the DAC unit 130 with arbitrary comparators constituting the comparison unit 150. For example, it is possible to connect the DAC2$k$-1 and DAC2$k$ ($k$=1 to m, 2 m=n) with the comparator k.

Reference numeral 150 denotes a comparison unit comprising comparator 1 to comparator m. Each comparator k compares the analog output values of the DACx and DACy (x, y=1 to n, but x≠y) which are outputted through the switch unit 140.

Further, the semiconductor IC testing apparatus 160 of the first embodiment includes the control unit 170 and the judgment unit 180. The control unit 170 controls the register setting unit 110 and the switch unit 140 which are included in the semiconductor IC 100. The judgment unit 180 judges the comparison result of the comparison unit 150.

Next, the operation of the semiconductor IC testing apparatus 160 of the first embodiment will be described. In order to select DACs to be tested, the switch unit 140 is set by the control unit 170 so as to connect arbitrary two DACs with an arbitrary comparator which compares the magnitudes of the analog output values of the two DACs.

Hereinafter, a description will be given of a case where the comparator 1 compares the magnitudes of the analog output values of the DAC1 and DAC2, and the judgment unit 180 performs a pass/fail judgment for the DACs. It is possible to perform a similar pass/fail judgment for a pair of DAC3 and DAC4, . . . , a pair of DACn-1 and DACn, and the pass/fail judgments for all these pairs can be carried out in parallel.

In this first embodiment, an even digital input value and an odd digital input value are supplied to the DAC1 and DAC2 which have monotonically increasing properties in their outputs, respectively, and thereafter, an odd digital input value and an even digital input value are supplied to the DAC1 and DAC2, respectively, and the DACs are inspected according to whether or not the comparison result for the analog output values of the DAC1 and DAC2 matches an expected value which alternately repeats "1" and "0" and thereafter alternately repeats "0" and "1".

Figure 2:
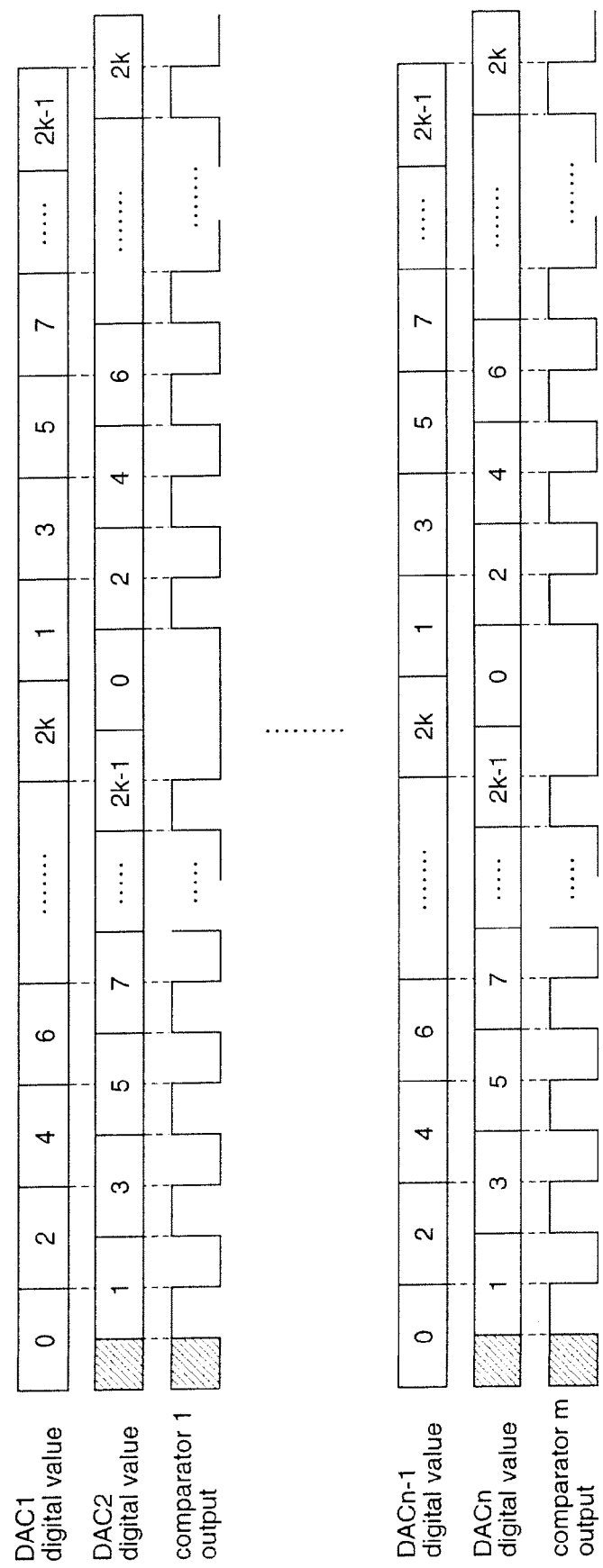
FIG. 2 is a diagram illustrating a setting pattern and a comparison result in the case where the digital input values of the DACs are increased "2" by "2" in the first embodiment.

That is, by the control unit 170, "0" is set as the digital input value of the DAC1 and, after a half cycle, "1" is set as the digital input value of the DAC2, as shown in FIG. 2. It is assumed that the output of the comparator 1 at this time is "1". In FIG. 2, hatching indicates a period when it is not determined whether the signal value is "1" or "0".

In the next one cycle, when the digital input value of the DAC1 is increased by only "2" and thereby it is set to "2", the output of the comparator 1 becomes "0". After a half cycle, when the digital input value of the DAC2 is increased by only "2" and thereby it is set to "3", the output of the comparator 1 becomes "1". In this way, the digital input values of the DAC1 and DAC2 are alternately set such that the digital input value of the DAC1 becomes the even number while the digital input value of the DAC2 becomes the odd number with being shifted by a half cycle from each other, and thereby "1" and "0" alternately appear in the output of the comparator 1.

Thereafter, in like manner as described above, the digital input values of the DAC1 and DAC2 are increased "2" by "2" with being shifted by a half cycle from each other. When the digital input value of the DAC1 reaches "2k" that is the settable upper limit value, the digital input value of the DAC2 is set to "0" and, after a half cycle, the digital input value of the DAC1 is set to "1", and thereafter, the digital input values of the DAC1 and DAC2 are increased "2" by "2" with being shifted by a half cycle from each other. In this way, the digital input values of the DAC1 and DAC2 are alternately set such that the digital input value of the DAC2 becomes the even number while the digital input value of the DAC1 becomes the odd number with being shifted by a half cycle from each other, and thereby "0" and "1" alternately appear in the output of the comparator 1.

If at least either of the DAC1 and DAC2 has such a drawback that its output is undesirably fixed to a specific voltage, the output of the comparator 1 would have a pattern in which "0" or "1" continuously appears, and the above-described output pattern in which "0" and "1" alternately appear cannot be obtained.

Therefore, the judgment unit 180 judges whether the output pattern of the comparator 1 matches the expected value, i.e., the pattern in which initially "1" and "0" alternately appear and then "0" and "1" alternately appear.

It is judged that both of the DAC1 and DAC2 are conforming units when the output pattern of the comparator 1 matches the expected value, and that at least one of the DAC1 and DAC2 is not a conforming unit when it does not match the expected value.

This judgment can be realized by storing the output of the comparator 1 in a shift register in the judgment unit 180, and comparing the same with the output of a ROM or the like in which the expected pattern is previously stored.

As described above, the output values of a pair of DACs are compared while successively changing the DAC to be a reference of the fail/pass judgment, i.e., one of the two DACs which is given a digital input value smaller than (or larger than) that given to the other DAC, and the judgment as to whether the semiconductor IC is a conforming product or not is performed according to whether the output pattern successively outputted from the comparator 1 matches the expected value or not. Therefore, the judgment as to whether the semiconductor IC is a conforming product or not can be speedily carried out with less number of comparisons.

However, it is premised that the DAC to be subjected to the pass/fail judgment should have a monotonically increasing property in its output, like a conforming resistance voltage division type DAC.

Figure 3:
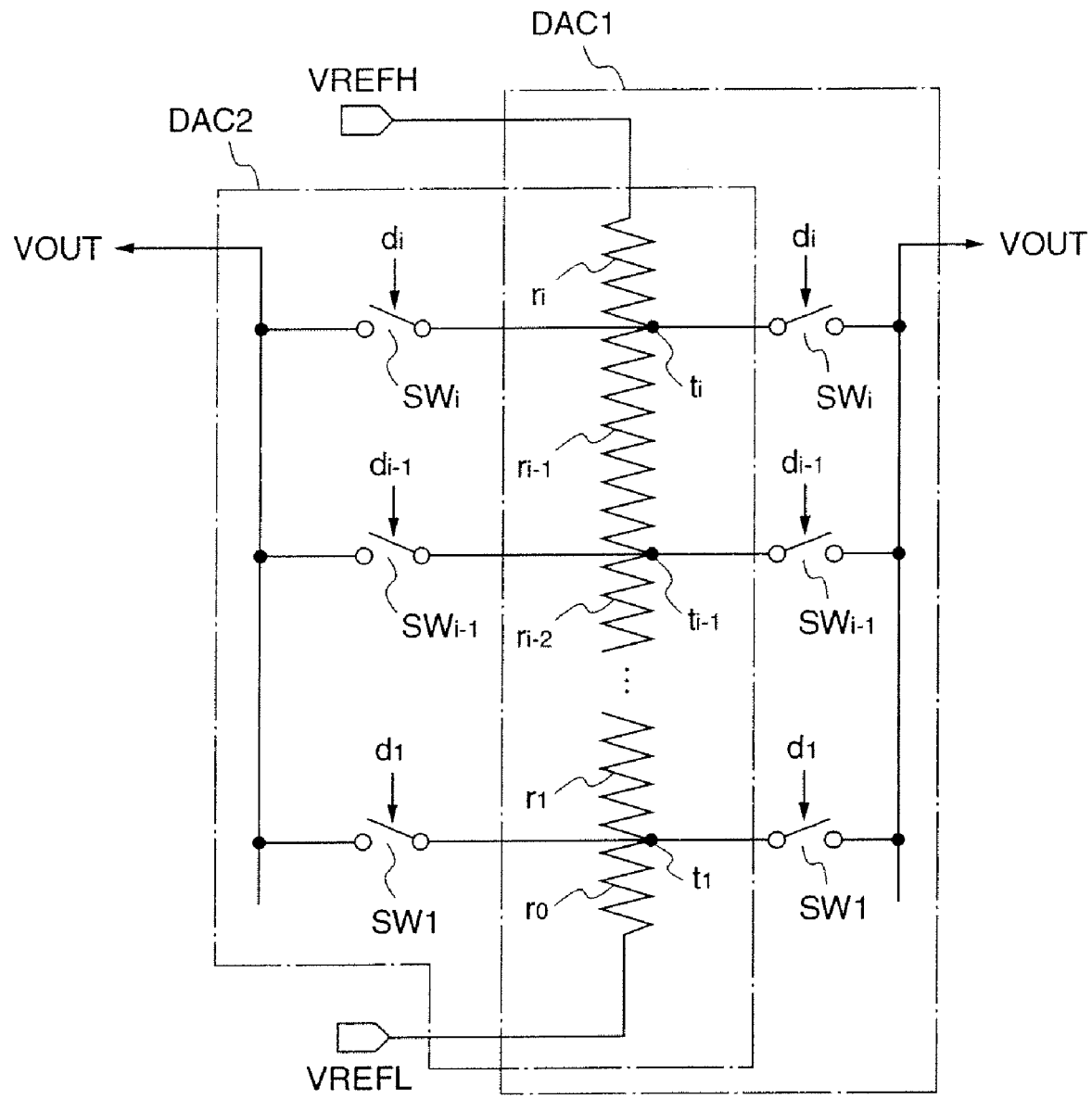
FIG. 3 is a diagram illustrating a construction of plural DACs which share resistors according to the first embodiment.

When each DAC is a resistance voltage division type DAC and plural DACs are voltage-divided with common resistances as shown in FIG. 3, it is possible to deal with a test for higher-resolution DACs.

In FIG. 3, r0, r1, . . . , ri−1, and ri denote resistances that are shared by the DAC1 and DAC2, and these resistances are connected in series between a higher voltage side reference voltage VREFH and a lower voltage side reference voltage VREFL.

The DAC1 and DAC2 have, in addition to the resistances, switches SW1, . . . , SWi−1, SWi which are respectively connected between the common connection points (taps) t1, . . . , ti−1, ti of the adjacent resistances and the analog output nodes VOUTs of the DACs, and these switches SW1, . . . , SWi−1, SWi are connected/disconnected by the respective bit signals d1, . . . , di−1, di constituting the digital inputs to the DACs. Further, as for the pairs of DACs other than the DAC1 and DAC2, plural pairs of DACs can be simultaneously tested by comparing them using the comparators other than the comparator 1 simultaneously with the DAC1 and DAC2.

Further, in the above-described example, the even natural numbers are given in the ascending order to the DAC1 while the odd natural numbers are given in the ascending order to the DAC2, and then the DAC1 and the DAC2 are replaced with each other. However, the odd numbers and the even numbers may be given in the ascending order to the DAC1 and to the DAC2, respectively, and then the DAC1 and the DAC2 may be replaced with each other. Alternatively, these numbers may be given in the descending order to the respective DACs, and then the both DACs may be replaced with each other.

Further, while in this first embodiment the digital input values of the DAC1 and DAC2 are varied with being shifted by a half cycle from each other, this shifting is not restricted to the half cycle, and it may be set to another value.

As described above, according to the first embodiment of the present invention, when performing a pass/fail judgment for plural DACs, even-number digital values are successively input to one of the DACs while odd-number digital values are successively input to the other DAC at a timing shifted by a half cycle, and the DA-converted outputs of these two DACs are compared by the comparator, and thereafter, odd-number digital values are successively input to the one DAC while even-number digital values are successively input to the other DAC, and then it is judged whether or not "1" and "0" alternately appear and thereafter "0" and "1" alternately appear in the output of the comparator, thereby to judge whether the semiconductor IC is conforming or not. Therefore, it is possible to speedily perform the judgment as to whether the semiconductor IC having the plural DACs is a conforming product or not.

Embodiment 2

Figure 4A:
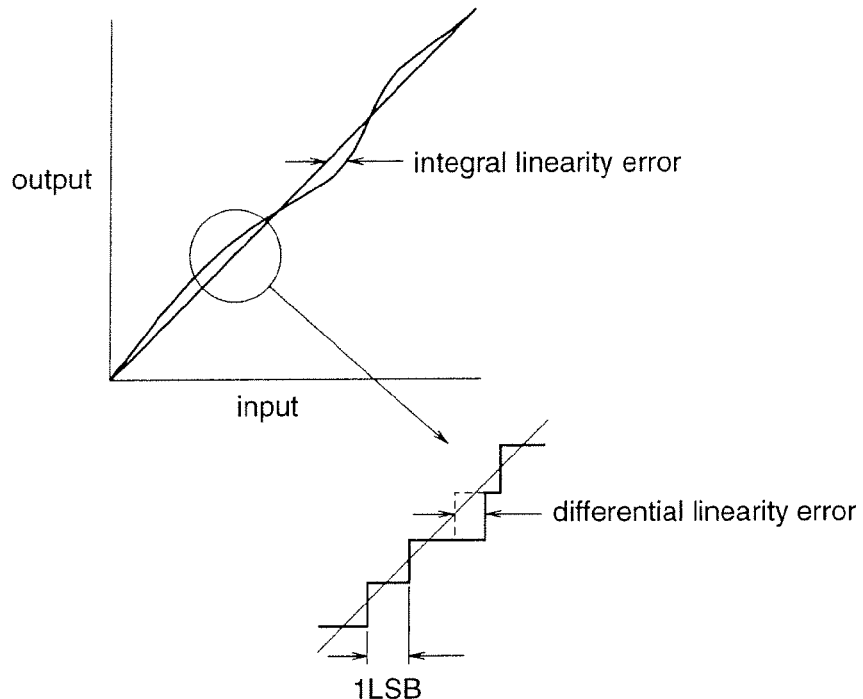
FIG. 4(a) is a diagram for explaining an integral linearity error and a differential linearity error of a DAC according to the first embodiment.

In the above-described first embodiment, the test for the semiconductor IC can be performed when the DAC subjected to the pass/fail judgment has a monotonically increasing property in its output. However, the test cannot be performed if the input/output characteristic of the DAC has an integral linearity error, i.e., a worst deviation value from an ideal value with respect to the whole range of the input/output characteristic, or a differential linearity error, i.e., a difference between a certain bit size and a theoretical bit size at an arbitrary point in the conversion range of the input/output characteristic, as shown in FIG. 4(a). This second embodiment is directed to solving this problem.

FIG. 4(a) is a diagram for explaining the DAC input/output characteristics, which is diverted from the diagram of the ADC input/output characteristics that is disclosed in "General Dictionary for VLSI", Science Forum Inc., Mar. 31, 1988, p. 686.

Figure 4B:
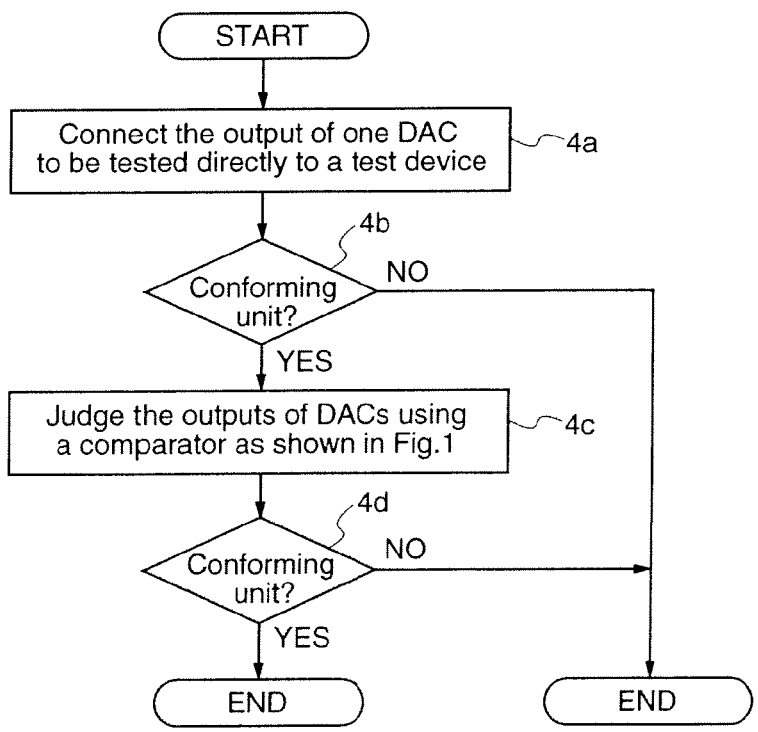
FIG. 4(b) is a flowchart illustrating a test method in the case where a DAC has an integral linearity error or a differential linearity error according to a second embodiment of the present invention.

FIG. 4(b) is a flowchart for explaining a test method according to the second embodiment.

Hereinafter, the second embodiment will be described with reference to FIG. 4(b). Initially, the analog output from one (DAC1) of a pair of DACs to be subjected to the test is previously input to a semiconductor IC testing apparatus or the like directly, i.e., without the comparison unit 150 shown in FIG. 1 intervening, and the analog output is previously tested for its integral linearity error or differential linearity error (step 4a).

If the integral linearity error or the differential linearity error is within a predetermined range and thereby the DAC is judged as a conforming unit (step 4b), thereafter, the above-described one DAC and the remaining DAC are tested by comparing them in a similar manner as described in the first embodiment, thereby to judge whether these DACs are conforming units or not (steps 4c and 4d).

Thereby, the remaining DAC can be indirectly subjected to the test relating to its integral linearity error or differential linearity error. In this case, it is possible to perform the test in a shorter time relative to the case where the two DACs are respectively subjected to the tests for the integral linearity errors or differential linearity errors.

Figure 4C:
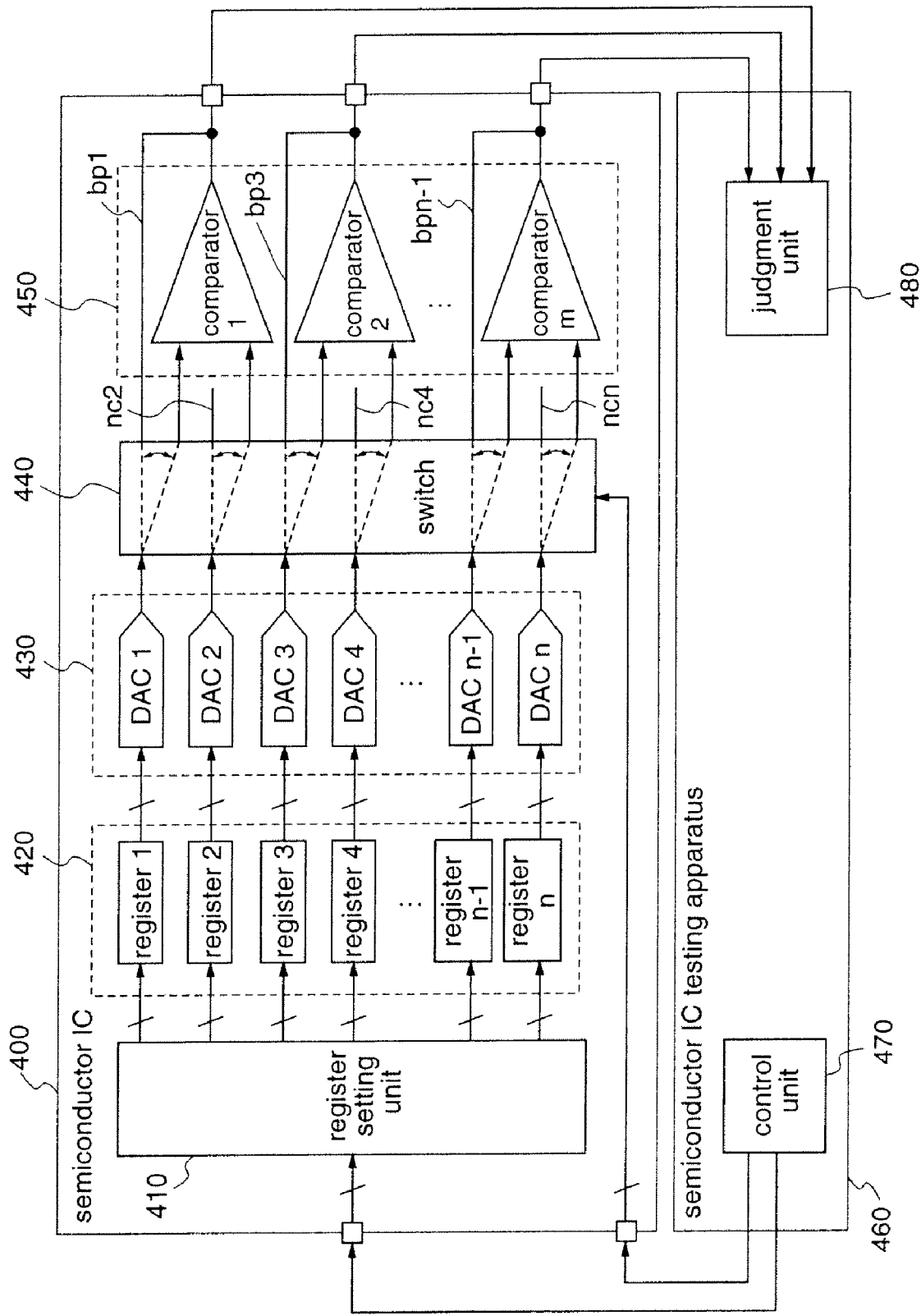
FIG. 4(c) is a diagram illustrating a construction of a semiconductor IC testing apparatus which can execute, by a single device, a test for an individual DAC and a test for judging the outputs of two DACs using a comparator.

FIG. 4(c) shows an example of a construction of a semiconductor IC testing apparatus which can realize the above-described tests in steps 4a and 4c by the same device.

With reference to FIG. 4(c), 400 denotes a semiconductor IC, 410 denotes a register setting unit, 420 denotes a register unit, 430 denotes a DAC unit, 440 denotes a switch unit which connects arbitrary DACs to arbitrary comparators, 450 denotes a comparison unit, bp1, bp3, . . . , bpn–1 denote bypass lines, and nc2, nc4, . . . , ncn denote no-connection nodes.

Further, 460 denotes a semiconductor IC testing apparatus, 470 denotes a control unit, and 480 denotes a judgment unit.

Among these elements, the register setting unit 410, the register unit 420, and the DAC unit 430 are identical to the register setting unit 110, the register unit 120, and the DAC unit 130 shown in FIG. 1, respectively.

On the other hand, the switch unit 440 that is newly provided in this second embodiment selects either of a connection of the DAC2$k$–1 and DAC2$k$ (k=1 to m) with the two inputs of the comparator k or a connection of the DAC2$k$–1 and DAC2$k$ with the bypass line bp2$k$–1 and the no-connection node nc2$k$.

The bypass lines bp1, bp3, . . . , bpn–1 connect the outputs of the DAC1, DAC3, . . . , DACn–1 which have passed inside the switch unit 440 with the outputs of the comparator 1, comparator 2, comparator m. The no-connection nodes nc2, nc4, . . . , ncn are nodes which are taken out of the switch unit 440 and connected to nowhere.

The switch unit 440 connects the outputs of the DAC2, DAC4, . . . , DACn to the no-connection nodes nc2, nc4, . . . , ncn when it connects the outputs of the DAC1, DAC3, . . . , DACn–1 to the bypass lines bp1, bp3, . . . , bpn–1.

Initially, the output of one DAC to be tested is controlled in step 4a. In this case, the control unit 470 controls the switch unit 440 so that the outputs of the DAC2$k$–1 and DAC2$k$ are connected to the bypass line by2$k$–1 and the no-connection node nc2$k$, respectively. In this case, the digital values that are set on the register 2$k$–1 and the register 2$k$ by the register setting unit 410 are converted into analog signals by the DAC2$k$–1 and the DAC2$k$, respectively. However, since the switch unit 440 is controlled as described above, the analog output of the DAC2$k$–1 passes through the bypass line bp2$k$–1 without being inputted to the input node of the comparator k, and appears at the output node of the comparator k, and this signal is outputted to the judgment unit 480. The analog output of the DAC2$k$–1 is judged in step 4b by the judgment unit 480 as to whether the integral linearity error or the differential linearity error included in this analog output is within the allowable range or not, and thereby it is judged whether the DAC2$k$–1 is a conforming unit or not. On the other hand, since the analog output of the DAC2$k$ is connected to the no-connection node nc2$k$, it is not judged whether the DAC2$k$ is conforming or not.

The process goes to step 4c when the DAC2$k$–1 is judged as a conforming unit, while the test is ended when it is judged as a nonconforming unit.

When the DAC2$k$–1 is a conforming unit, the outputs of the DACs are to be judged using the comparator in step 4c. At this time, the control unit 470 controls the switch unit 440 so that the outputs of the DAC2$k$–1 and DAC2$k$ are connected to the two inputs of the comparator k. In this case, the digital values that are set in the register 2$k$–1 and the register 2$k$ by the register setting unit 410 are converted into analog signals by the DAC2$k$–1 and DAC2$k$, and these analog signals are outputted to the two inputs of the comparator k via the switch unit 440. The analog outputs of the DAC2$k$–1 and DAC2$k$ are judged in step 4d by the judgment unit 480 as to whether or not the output of the comparator k has the output pattern in which "0" and "1" alternately appear, and thereby it is speedily judged whether the DAC2$k$ is a conforming unit or not. That is, when the output of the comparator k matches the expected value, the DAC2$k$ is judged as a conforming unit. When it does not match the expected value, the DAC2$k$ is judged as a nonconforming unit and the test is ended.

By setting the switch unit so as to simultaneously compare the DAC1 with the remaining DACs using plural comparators in the similar manner as described in the first embodiment, the test can be performed in a shorter time.

As described above, according to the second embodiment, when judging whether two DACs are conforming or not, the two DACs are subjected to the similar test as performed in the first embodiment after one of the DACs is tested using the ordinary semiconductor device testing apparatus. Therefore, even when the outputs of the DACs include the integral linearity errors or differential linearity errors, it is possible to speedily judge whether the DACs are conforming or not.

Embodiment 3

In the above-described first embodiment, the DAC to be subjected to the pass/fail judgment must be one having a monotonically increasing property in its output when it is a conforming unit, such as a voltage division type (resistance division type) DAC. A third embodiment of the present invention realizes the tests for DACs of more conversion methods.

Figure 5A:
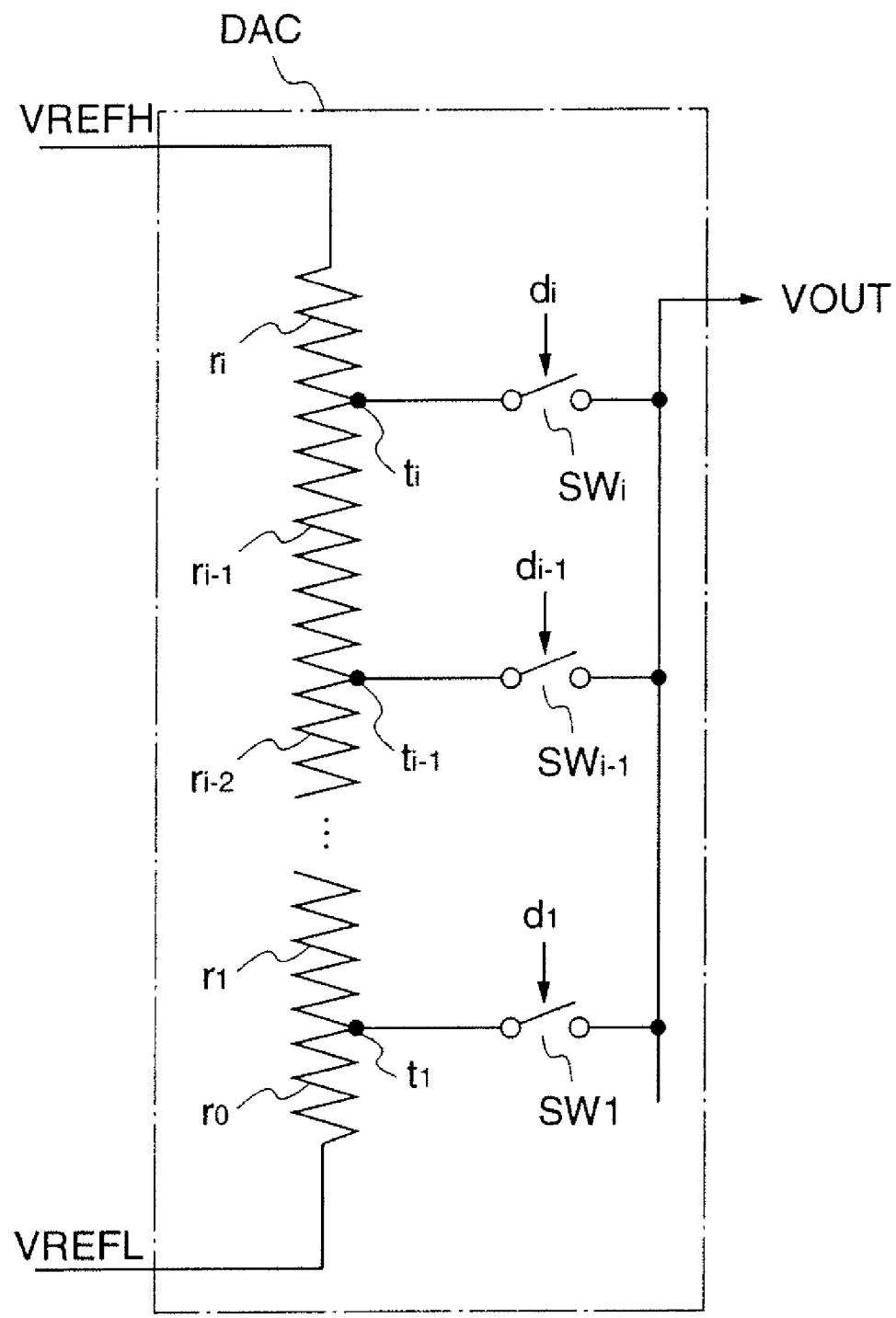
FIG. 5(a) is a diagram illustrating a constitutional example of the voltage division type DAC.

Hereinafter, the third embodiment will be described. When comparing two DACs, it is assumed that the DACs to be compared with each other are resistance voltage division type DACs as shown in FIG. 5(a), which are defined as DAC1 and DAC2. The analog output value outputted from each DAC is determined depending on voltages applied to the both ends of the resistance.

Assuming that the voltages applied to the both ends of the resistance are a higher voltage side reference voltage VREFH and a lower voltage side reference voltage VREFL (VREFH1 and VREFL1 for the DAC1, and VREFH2 and VREFL2 for the DAC2), the output voltage of the DAC becomes a voltage obtained by dividing the reference voltages VREFH and VREFL.

Figure 5B:
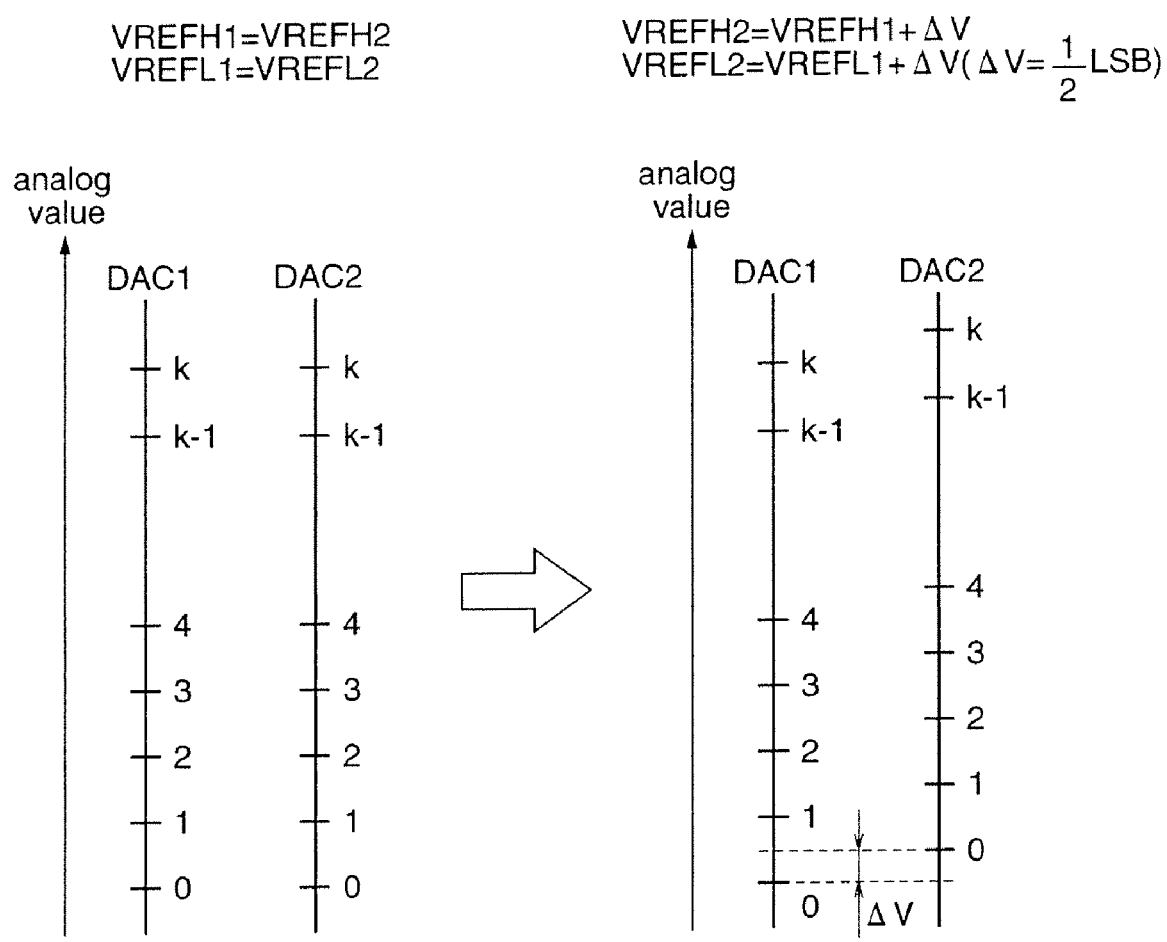
FIG. 5(b) is a diagram illustrating the analog values obtained in the case where an offset is given to the DACs according to a third embodiment of the present invention.

In this way, the DAC1 and the DAC2 are constructed so that the respective reference voltages thereof can be independently set, and the reference voltages at the both ends of one DAC (the DAC2 in the example of FIG. 5(b)) are increased by ΔV, whereby the analog output value corresponding to the digital input value is also increased by ΔV. That is, even when the digital input values of the DAC1 and DAC2 are the same, the analog output value of the DAC2 becomes by ΔV higher than that of the DAC1.

Figure 5C:
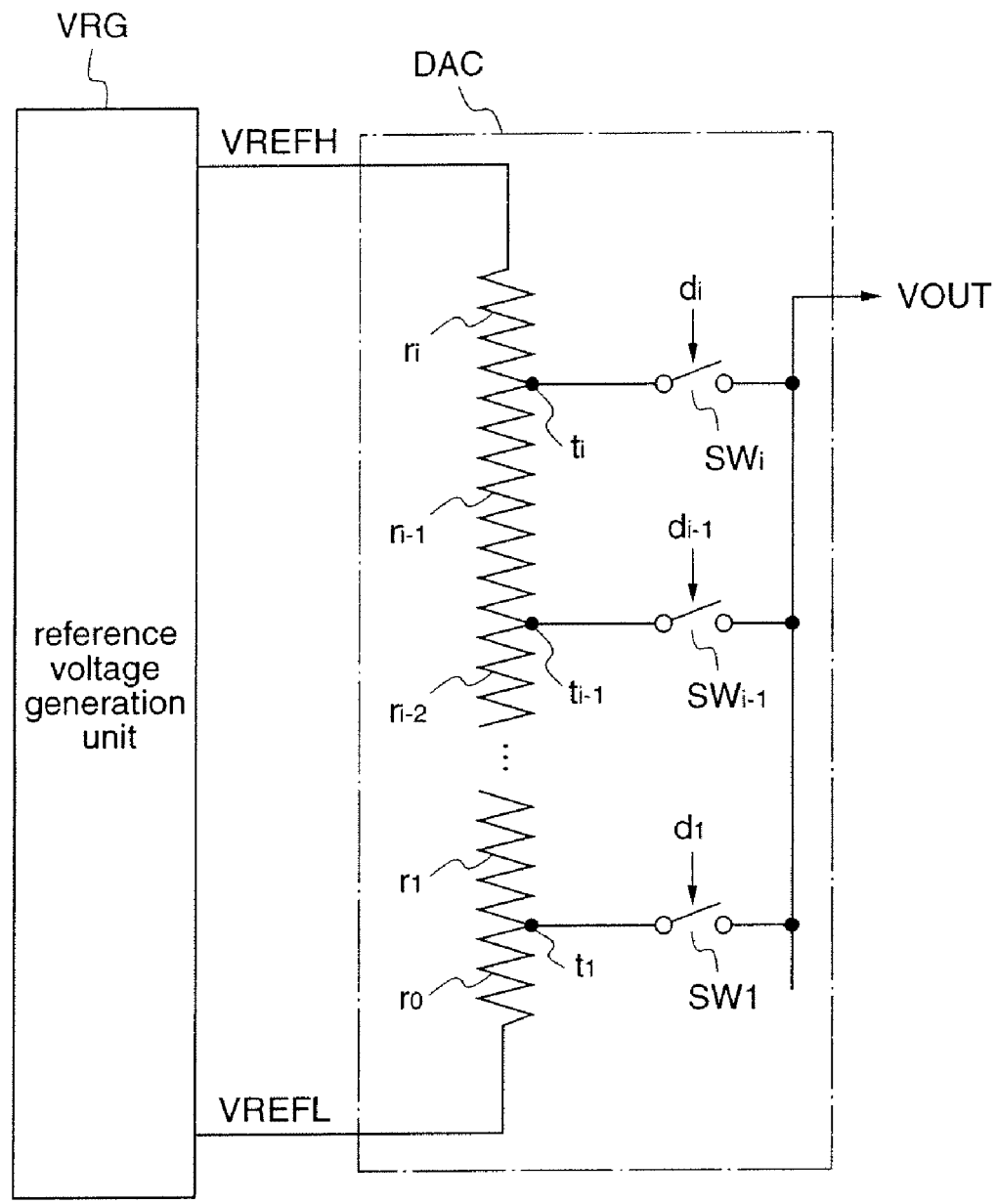
FIG. 5(c) is a diagram illustrating a constitutional example of a voltage division type DAC which can vary a reference voltage.

FIG. 5(c) shows the construction of the voltage division type DAC in which the reference voltages can be independently set as described above. In FIG. 5(c), VRG denotes a reference voltage generation unit which applies the higher voltage side reference voltage VREFH and the lower voltage side reference voltage VREFL to the DAC.

Figure 5D:
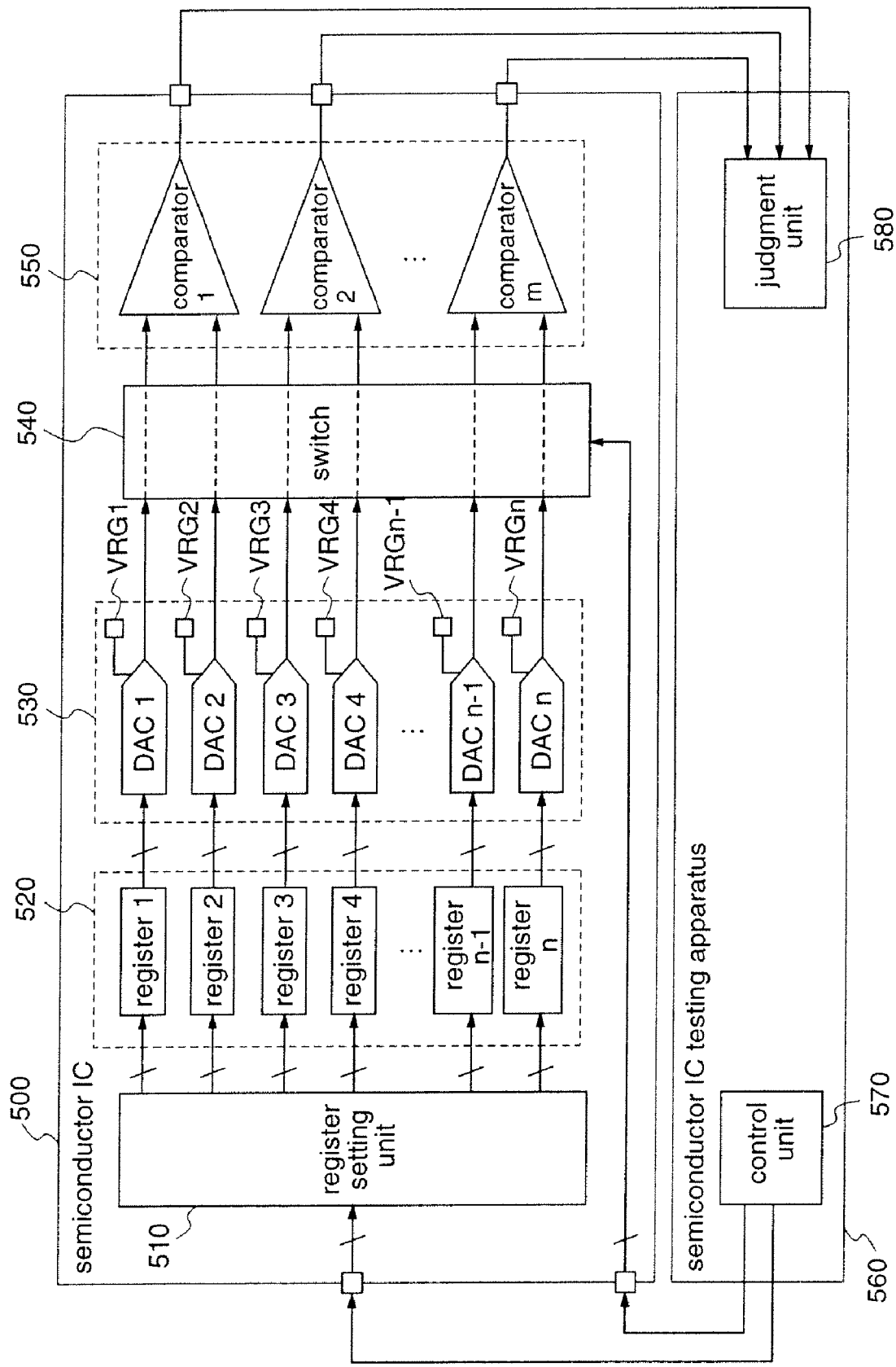
FIG. 5(d) is a diagram illustrating the constructions of a semiconductor IC and a semiconductor IC testing apparatus according to the third embodiment of the present invention.

FIG. 5(d) shows the construction of a semiconductor IC including the DAC in which the reference voltages can be independently set.

In FIG. 5(d), reference numeral 500 denotes a semiconductor IC, 510 denotes a register setting unit, 520 denotes a register unit which sets digital values of DACs, 530 denotes a DAC unit, 540 denotes a switch unit which connects arbitrary DACs with arbitrary comparators, 570 denotes a control unit, and 580 denotes a judgment unit.

The register unit 520, the switch unit 540, the comparator unit 550, and the judgment unit 580 are identical to the register unit 120, the switch unit 140, the comparator unit 150, and the judgment unit 180 shown in FIG. 1, respectively.

In contrast, the DAC unit 530 is different from the DAC unit 130 shown in FIG. 1, and the DAC1 to DACn have reference voltage generators VRG1 to VRGn. The reference voltage generators VRG1, VRG3, . . . , VRGn−1 output VREFH1 and VREFL1 as the reference voltages to the DAC1, DAC3, . . . , DACn−1, respectively, while the reference voltage generators VRG2, VRG4, . . . , VRGn output VREFH2 and VREFL2 as the reference voltages to the DAC2, DAC4, . . . , DACn, respectively.

Figure 6:
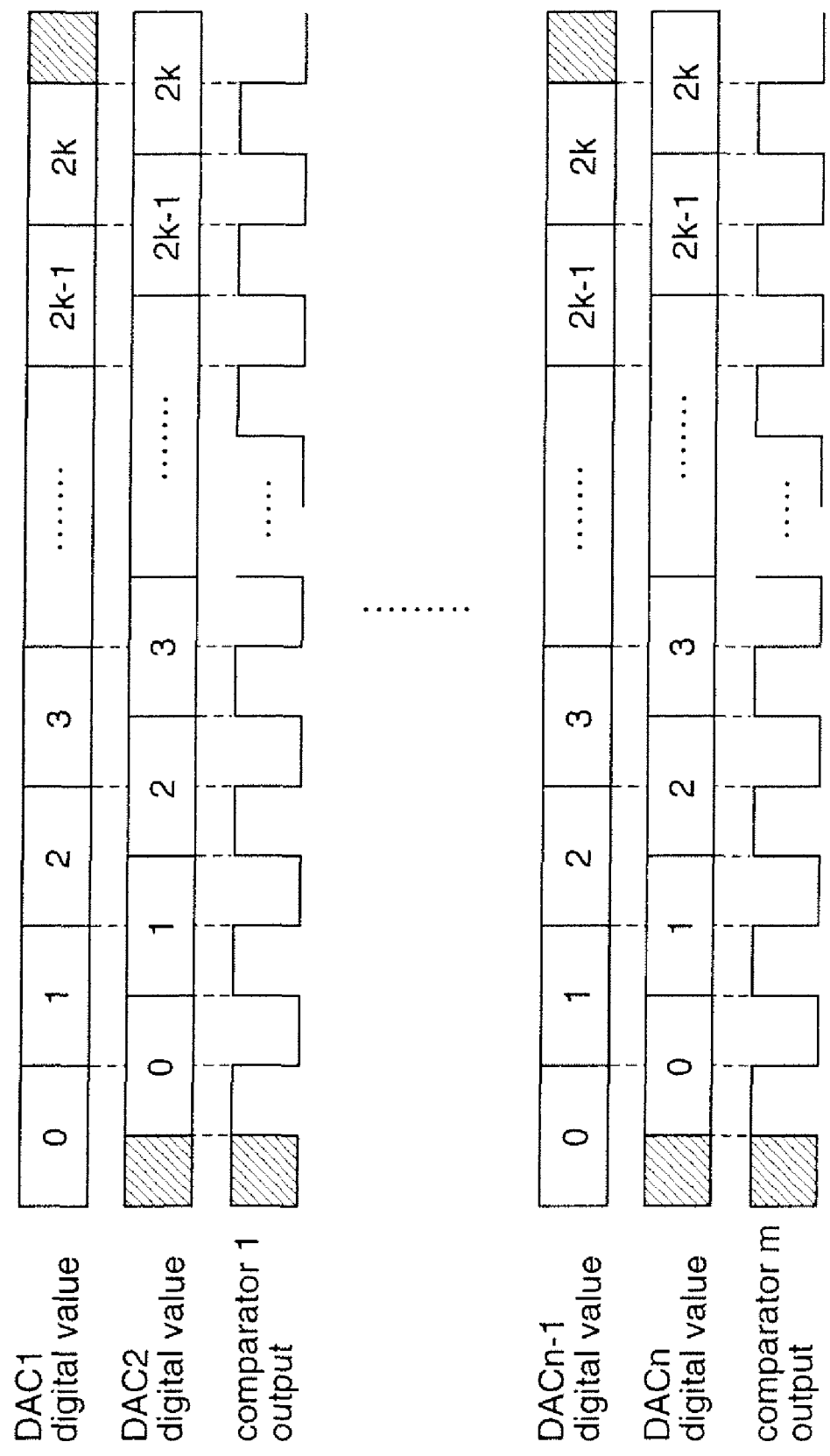
FIG. 6 is a diagram illustrating the setting patterns of the digital values of DACs and the comparison result in the case where the digital input values of the DACs are increased "1" by "1".

When the DAC1, DAC3, . . . , DACn−1 are compared with the DAC2, DAC4, . . . , DACn after setting ΔV (=VREFH2−VREFH1 (=VREFL2−VREFL1)) so as to be equal to about half of one step of the DAC, as shown in FIG. 6, the digital input values are increased each by one step with being shifted by a half cycle from each other, and thereby the comparison results of the comparator 1, comparator 2, . . . , comparator m are inverted for every half cycle. In this way, it is possible to judge whether the DAC1, DAC3, . . . , DACn−1 and the DAC2, DAC4, . . . , DACn are conforming units or not, according to whether the comparison results of the comparator 1, comparator 2, . . . , comparator m are inverted for every half cycle or not. Further, since the digital values of the compared DACs can be increased one step by one step, also the DACs of the conversion system other than the voltage division system can be subjected to the test.

That is, the conversion system of the DACs may be other than the voltage division system so long as it can shift the analog output value by ΔV.

As described above, according to the third embodiment, one of two DACs for which the lower voltage side reference voltages and the higher voltage side reference voltages can be individually set is given a higher voltage side reference voltage and a lower voltage side reference voltage which are shifted each by (½) LSB from those given to the other DAC while the same digital input value is given to the both DACs, and the analog output values of the two DACs are compared. Therefore, even the DACs other than the voltage division type DACs can be tested so long as the DACs are of the conversion type that can shift the analog output values thereof by ΔV. Further, since the digital input values to be input to the DACs whose analog output values are compared are increased "1" by "1", the control operation of the register setting unit can also be simplified.

Embodiment 4

In the above-described, first, second, and third embodiments, when the DACs have high resolutions and an offset exists between the analog output values of the two DACs to be compared even though the digital input values thereof are the same or an offset exists between the two inputs of the comparator, the output pattern of the comparator becomes different from the expected value if the register setting unit for setting the digital input values of the DACs has a fixed pattern, and the test cannot be executed. A fourth embodiment of the present invention is directed to solving this problem.

Although an offset exists also in the third embodiment, it is only ½ of the LSB (=the digital input value "1"). In this fourth embodiment, however, an offset has a value larger than the digital input value "1".

Hereinafter, the fourth embodiment will be described. In this fourth embodiment, the semiconductor devices and the semiconductor device testing apparatuses which are used in the first, second and third embodiments can be used.

Initially, when a DAC1 and a DAC2 are subjected to a pass/fail judgment, a procedure of determining an offset value between them and comparing the two DACs by a comparator 1 will be described with reference to FIG. 7.

Figure 7:
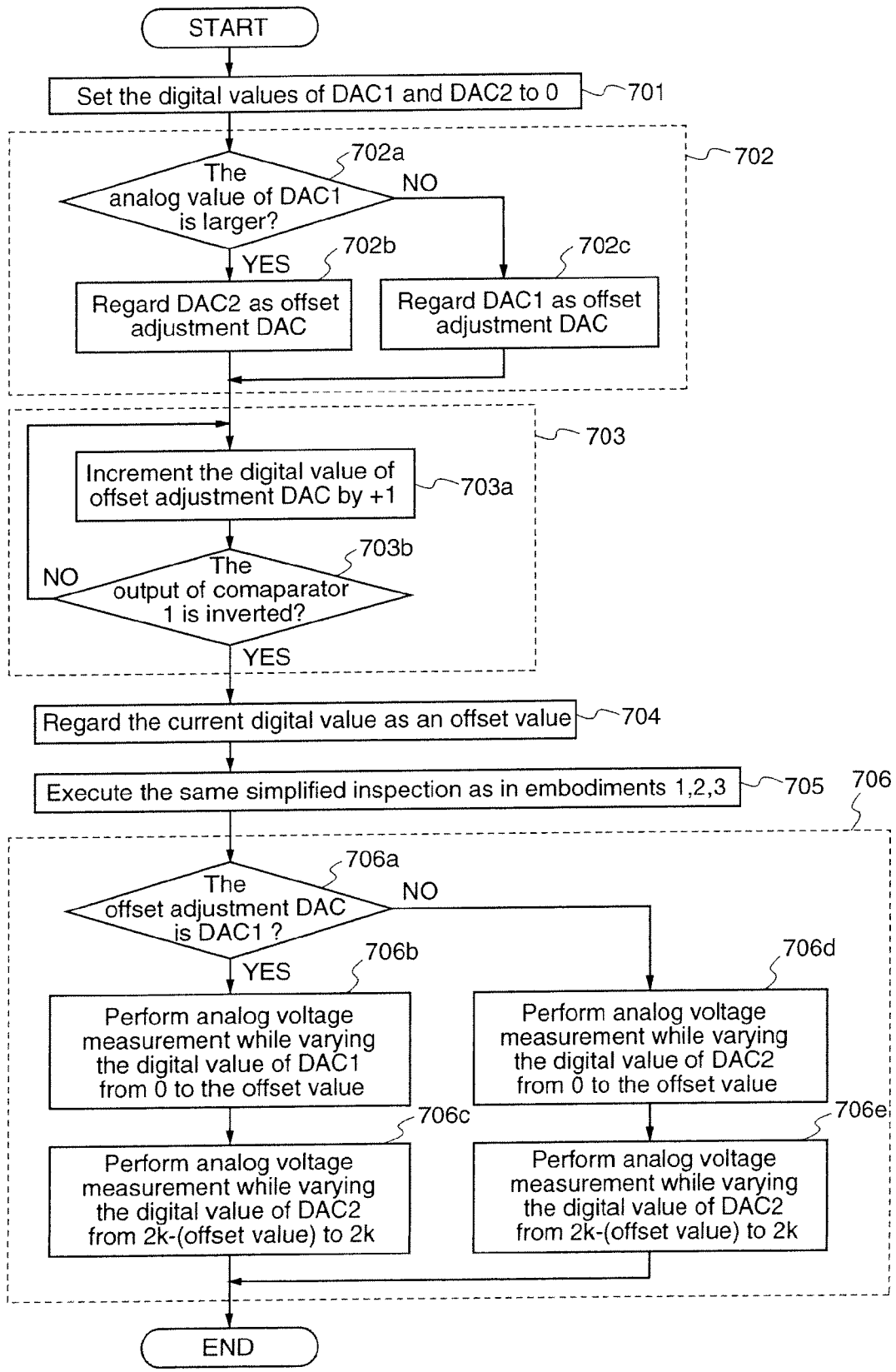
FIG. 7 is a diagram illustrating a procedure of offset value detection according to a fourth embodiment of the present invention.

In FIG. 7, the digital input values of the DAC1 and DAC2 are set to "0" (step 701). Then, the magnitudes of the analog output values of the DAC1 and DAC2 are judged according to the result outputted from the comparator 1 (step 702*a*). When it is judged that the analog output value of the DAC1 is larger than that of the DAC2, the DAC2 is regarded as a DAC whose offset should be adjusted (hereinafter referred to as an offset adjustment DAC) (step 702*b*). When it is judged that the analog output value of the DAC2 is larger than that of the DAC1, the DAC1 is regarded as an offset adjustment DAC (step 702*c*).

Next, the digital input value of the offset judgment DAC is increased "1" by "1" (step 703*a*). When the output of the comparator 1 is inverted (step 703*b*), the process goes to the next step, and the current digital value of the offset adjustment DAC is adopted as an offset value (step 704). This step functions as an offset correction part which corrects the input offset.

In this state, a simplified test similar to that performed in the first, or second, or third embodiment is carried out, i.e., the outputs of the two DACs are compared with each other, and it is judged whether the comparison result matches the expected value or not, thereby speedily performing the test (step 705). Further, the state where the measurement cannot be performed when an offset exists is individually inspected (step 706). Thereby, even when an output offset exists between the two DACs although the same digital input value is applied thereto or when an input offset exists in the comparator, the test for the DACs can be performed.

That is, in step 706, it is judged whether the offset adjustment DAC is the DAC1 or the DAC2 (step 706*a*).

When it is judged in step 706*a* that the offset adjustment DAC is the DAC1, the voltage of its analog output value is measured while varying its digital input value from "0" to the offset value (step 706*b*), and then the voltage of the analog output value of the DAC2 is measured while varying its digital input value from (2k—"offset value") to 2k (step 706*c*). When it is judged that the offset adjustment DAC is the DAC2, the same operation as described above is performed with the DAC1 and the DAC2 being replaced with each other.

That is, when it is judged in step 706*a* that the offset adjustment DAC is the DAC2, the voltage of its analog output value is measured while varying its digital input value from "0" to the offset value (step 706*d*), and then the voltage of the analog output value of the DAC1 is measured while varying its digital input value from (2k—"offset value") to 2k (step 706*e*).

According to the steps 706*a* to 706*e*, the state where the test cannot be executed in step 705, i.e., the analog output values of the DAC1 and DAC2 in an area other than the area where the output dynamic ranges thereof overlap each other, can be individually measured.

As described above, according to the fourth embodiment, the same digital input value is given to two DACs and the analog output values thereof are compared with each other, the DAC having the smaller analog output value is regarded as an offset adjustment DAC and the digital input value thereof is increased "1" by "1" until its output is inverted, the similar test as those described in the first to third embodiments is performed using, as offset values, the digital input values at the timing when the comparison result for the analog output values is inverted, and it is judged whether the offset adjustment DAC is the DAC of the larger analog output value or the DAC of the smaller analog output value, and then the analog output value of the corresponding DAC is measured while varying its digital input value from "0" to the offset value, and thereafter, the analog voltage of the other DAC is measured while varying its digital input value from (2k—"offset value") to 2k. Therefore, even when an output offset exists between the two DACs or when an input offset exists in the comparator, it is possible to speedily judge whether the DACs are conforming or not.

Embodiment 5

In the above-described first embodiment, the semiconductor device testing apparatus performs the control for the digital input values of the DACs. Therefore, the semiconductor IC requires a lot of test terminals, and tester channels for controlling these test terminals are required during the test. However, there is a restriction on the tester channels to be mounted on the semiconductor device testing apparatus, and the number of DACs which can be simultaneously tested is restricted due to an increase in the test terminals. The fifth embodiment of the present invention is directed to solving this problem. Hereinafter, this fifth embodiment will be described with reference to FIG. 8.

Figure 8:
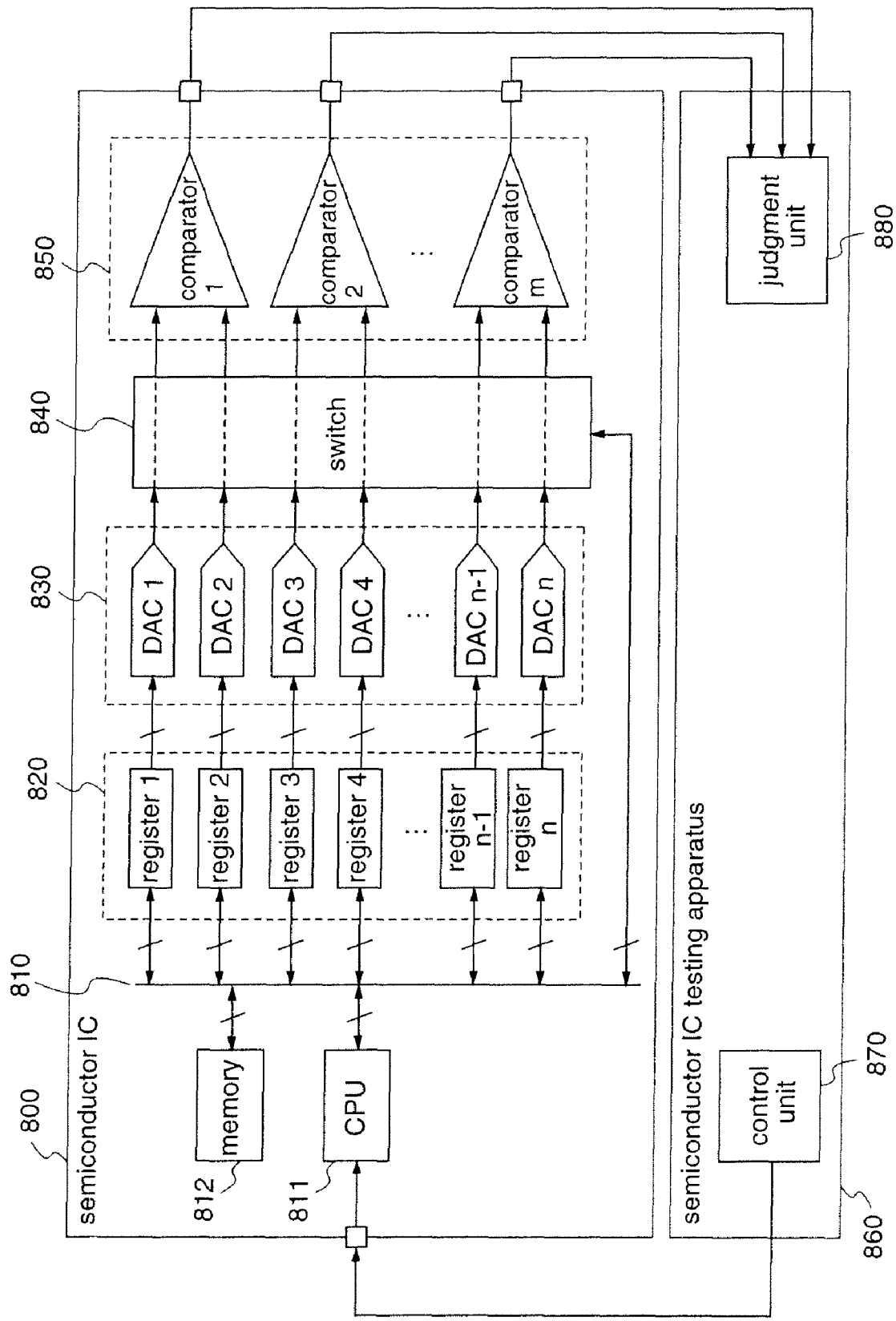
FIG. 8 is a diagram illustrating a construction in the case where a CPU controls DACs according to a fifth embodiment of the present invention.

In FIG. 8, reference numeral 800 denotes a semiconductor IC, 810 denotes a CPU bus, 811 denotes a CPU, 812 denotes a memory, 820 denotes a register unit for setting the digital values of DACs, 830 denotes a DAC unit, 840 denotes a switch unit for connecting arbitrary DACs with arbitrary comparators, and 850 denotes a comparison unit. Further, 860 denotes a semiconductor IC testing apparatus, 870 denotes a control unit, and 880 denotes a judgment unit.

The register unit 820, the DAC unit 830, the switch unit 840, the comparison unit 850, and the judgment unit 880 are identical to the register unit 120, the DAC unit 130, the switch unit 140, the comparison unit 150, and the judgment unit 180 shown in FIG. 1, respectively.

The CPU 811 performs an operation according to a program stored in the memory 812. The memory 812 stores a program for setting the register unit 820 and the switch unit 840 in the same manner as shown in FIG. 1. The control unit 870 generates a trigger signal that controls the start of the operation of the CPU 811.

Next, the operation of the fifth embodiment will be described.

Upon starting the test for the DACs, the control unit 870 sends a signal to the CPU 811. On receipt of the signal, the CPU 811 controls the register unit 820 and the switch unit 840 according to the program stored in the memory 812.

That is, the CPU 811 controls the switch unit 840 so that the DAC2k−1 and the DAC2k (k=1 to m, 2 m=n) are connected to the comparator k.

Further, the CPU 811 successively sets the values of the register 1, register 3, . . . , register n−1 to 0, 2, . . . , 2k, 1, 3, . . . , 2k−1, and sets, with a delay of a half cycle, the values of the register 2, register 4, . . . , register n to 1, 3, . . . , 2k−1, 0, 2, . . . , 2k, respectively.

Thereby, "0" is set as the digital input values of the DAC1, DAC3, . . . , DACn−1 and, after a half cycle, "1" is set as the digital input values of the DAC2, DAC4, . . . , DACn. It is assumed that the outputs of the comparator 1, comparator 2, . . . comparator m at this time are "1". The hatching in the figure shows a period where it is not determined whether the signal value is "1" or "0".

In the next one cycle, the digital input values of the DAC1, DAC3, . . . , DACn−1 are increased each by "2" to be set at "2", whereby the outputs of the comparator 1, comparator 2, . . . , comparator m become "0". After a half cycle, the digital input values of the DAC2, DAC4, . . . , DACn are increased each by "2" to be set at "3", whereby the outputs of the comparator 1, comparator 2, . . . , comparator m become "1". In this way, the digital input values of the respective DACs are alternately set such that the digital input values of the DAC1, DAC3, . . . , DACn−1 become the even numbers and those of the DAC2, DAC4, . . . , DACn become the odd numbers with being shifted by a half cycle from each other, whereby "1" and "0" alternately appear in the outputs of the comparator 1, comparator 2, . . . , comparator m.

To be specific, the digital input values of the DAC1, DAC3, . . . , DACn−1 and the digital input values of the DAC2, DAC4, . . . , DACn are increased "2" by "2" with being shifted by a half cycle from each other. When the digital input values of the DAC1, DAC3, . . . , DACn−1 reach "2k" which is the settable upper limit value, the digital input values of the DAC2, DAC4, . . . DACn are set to "0" and, after a half cycle, the digital input values of the DAC1, DAC3, . . . , DACn−1 are set to "1", and thereafter, the digital input values of the DAC1, DAC3, . . . , DACn−1 and the digital input values of the DAC2, DAC4, . . . , DACn are increased "2" by "2" with being shifted by a half cycle from each other. In this way, the digital input values of the respective DACs are alternately set such that the digital input values of the DAC2, DAC4, . . . , DACn become the even numbers and those of the DAC1, DAC3, . . . , DACn−1 become the odd numbers with being shifted by a half cycle from each other, whereby "0" and "1" alternately appear in the outputs of the comparator 1, comparator 2, . . . , comparator m.

If there is a drawback that at least either of the outputs of the DAC1, DAC3, . . . , DACn−1 or the outputs of the DAC2, DAC4, . . . DACn are fixed to a specific voltage, the outputs of the comparator 1, comparator 2, . . . , comparator m would have a pattern in which "0" or "1" continuously appears, and the above-described output pattern in which "0" and "1" alternately appear is not obtained.

Therefore, it is judged by the judgment unit 180 as to whether or not the output patterns of the comparator 1, comparator 2, . . . , comparator m match the expected value, i.e., the pattern in which initially "1" and "0" alternately appear and then "0" and "1" alternately appear.

When the output patterns of the comparator 1, comparator 2, . . . , comparator m match the expected value, the DAC1 and DAC2, the DAC3 and DAC4, . . . , the DACn−1 and DACn are judged as conforming units. When there is no match, at least either of the DAC1 and DAC2, the DAC3 and DAC4, . . . , the DACn−1 and DACn is judged as a nonconforming unit.

As described above, according to the fifth embodiment, the CPU mounted on the semiconductor IC performs the settings of the register unit and the switch unit according to the program stored in the memory, and the control unit mounted on the semiconductor IC testing apparatus merely controls the start of the operation of the CPU. Therefore, the connection between the semiconductor IC and the semiconductor IC testing apparatus can be achieved by a small number of wirings, and thereby the number of the test terminals provided on the semiconductor IC can be minimized. Further, the number of the terminals provided in the semiconductor IC testing apparatus can also be minimized.

Also in the second, third, and fourth embodiments, the respective tests can be executed by that the CPU 811 performs the control according to the program stored in the memory 812, instead of the control unit in the semiconductor device testing apparatus.

Embodiment 6

In the above-described first to fifth embodiments, the semiconductor device testing apparatus is required for the tests. A semiconductor integrated circuit of this sixth embodiment can be tested without using the semiconductor device testing apparatus. Hereinafter, the sixth embodiment will be described with reference to FIG. 9.

Figure 9:
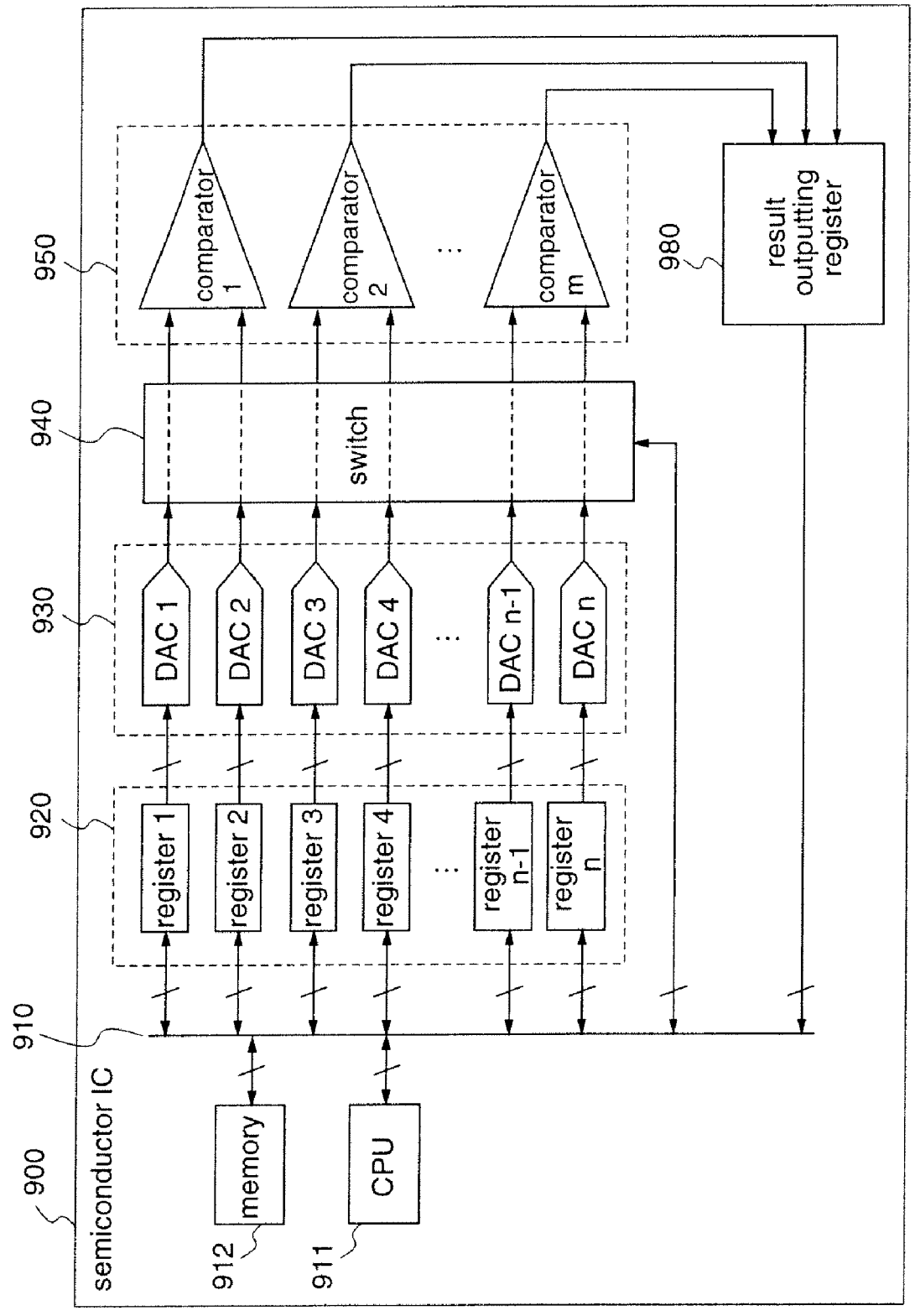
FIG. 9 is a diagram illustrating the construction in the case where a CPU controls DACs and a semiconductor IC executes a test by itself, according to a sixth embodiment of the present invention.

In FIG. 9, reference numeral 900 denotes a semiconductor IC, 910 denotes a CPU bus, 911 denotes a CPU, 912 denotes a memory, 920 denotes a register unit which sets digital values of DACs, 930 denotes a DAC unit, 940 denotes a switch unit which connects arbitrary DACs with arbitrary comparators, 950 denotes a comparison unit, and 980 denotes a result outputting register.

The CPU bus 910, the CPU 911, the memory 912, the register unit 920, the DAC unit 930, the switch unit 940, and the comparison unit 950 are identical to the CPU bus 810, the CPU811, the memory 812, the register unit 820, the DAC unit 830, the switch unit 840, and the comparison unit 850 shown in FIG. 8, respectively.

The result outputting register 980 is mounted on the semiconductor IC 900, and it holds the comparison result of the comparison unit 950 and outputs the same to the CPU bus 910.

Next, the operation of the sixth embodiment will be described.

The controls for the DACs and the switch unit are performed in the similar manners as described in the fifth embodiment, and the comparison result of the comparison unit 950 is outputted to the CPU bus 910 through the result outputting register 980. The CPU 911 reads the value stored in the result outputting register via the CPU bus 910 according to the program stored in the memory 912, and compares the same with the expected value to perform a pass/fail judgment. To be specific, if the DAC1 and DAC2, the DAC3 and DAC4, . . . , the DACn−1 and DACn are conforming units, the outputs of the comparator 1, comparator 2, . . . , comparator m would be the expected value, i.e., the pattern in which "1" and "0" alternately appear and then "0" and "1" alternately appear. These m pieces of output patterns are stored in the result outputting register 980, and the stored results are outputted to the CPU 911 via the CPU bus 910. The CPU 911 judges whether the respective output patterns outputted from the result outputting register 980 match the above-described expected value or not, and thus the CPU 911 also serves as a judgment unit. Thereby, the semiconductor IC can perform the test by itself.

As described above, according to the sixth embodiment, the result outputting register mounted on the semiconductor IC holds the comparison result of the comparison unit and outputs the same to the CPU in the semiconductor IC, and the CPU judges the comparison result. Therefore, the test for the DACs can be executed by the semiconductor IC alone without using the semiconductor IC testing apparatus.

Embodiment 7

In the above-described sixth embodiment, the CPU must execute the program for the test, and the CPU cannot be used for other purposes during the execution of the test. The seventh embodiment of the present invention is directed to solving this problem. Hereinafter, the seventh embodiment will be described with reference to FIG. 10.

Figure 10:
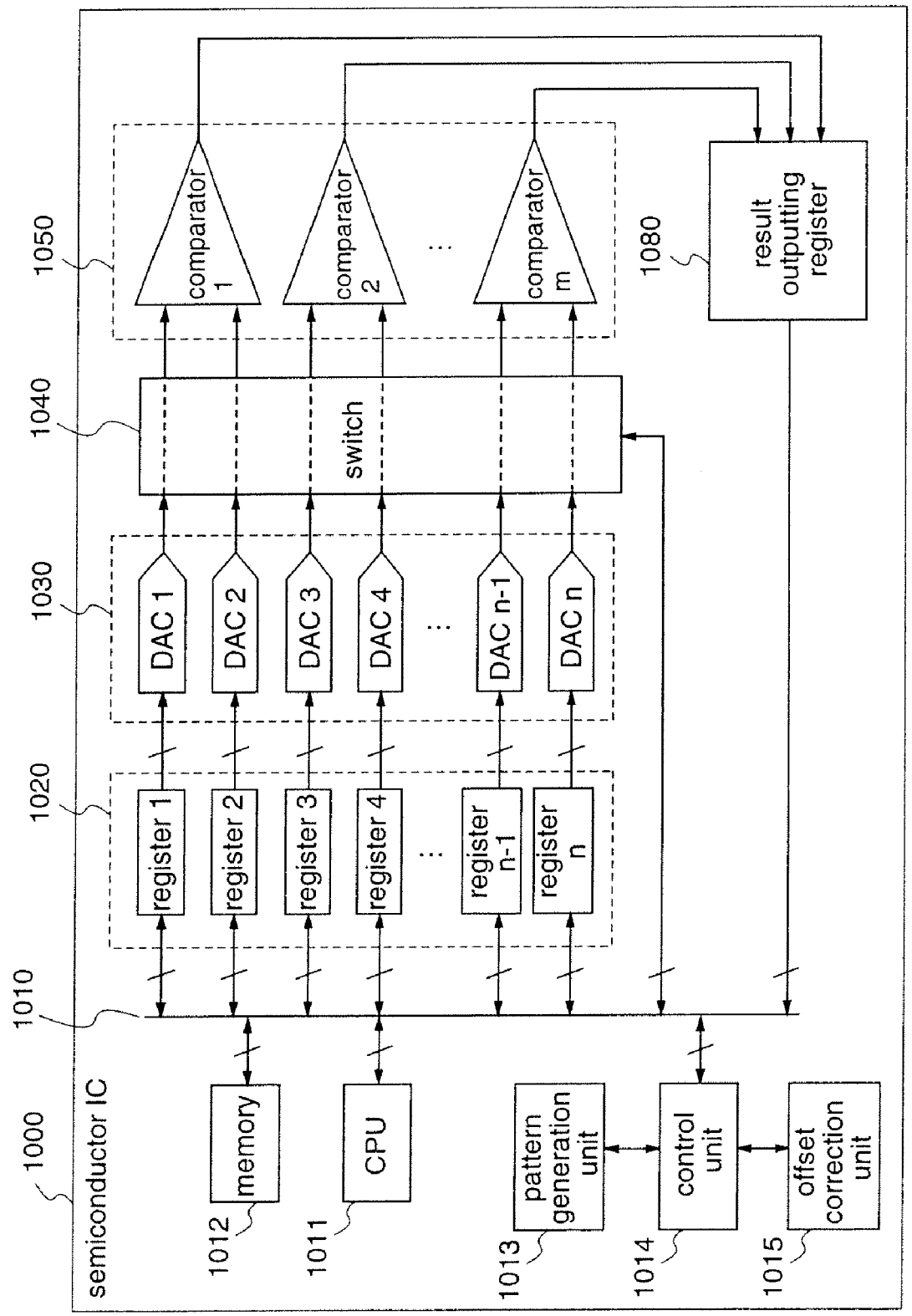
FIG. 10 is a diagram illustrating the construction in the case where a special control circuit controls DACs and a semiconductor IC executes a test by itself, according to a seventh embodiment of the present invention.

In FIG. 10, reference numeral 1000 denotes a semiconductor IC, 1010 denotes a CPU bus, 1011 denotes a CPU, 1012 denotes a memory, 1013 denotes a pattern generation unit, 1014 denotes a control unit, 1015 denotes an offset correction unit, 1020 denotes a register unit which sets the digital values of DACs, 1030 denotes a DAC unit, 1040 denotes a switch unit which connect arbitrary DACs with arbitrary comparators, 1050 denotes a comparison unit, and 1080 denotes a result outputting register which outputs the comparison results obtained by the comparison unit to the CPU bus 1010.

The CPU bus 1010, the CPU 1011, the memory 1012, the register unit 1020, the DAC unit 1030, the switch unit 1040, the comparison unit 1050, and the result outputting register 1080 are identical to the CPU bus 910, the CPU 911, the memory 912, the register unit 920, the DAC unit 930, the switch unit 940, the comparison unit 950, and the result outputting register 980 shown in FIG. 9, respectively.

The pattern generation unit 1013 generates a pattern for setting the register unit 1020. The offset correction unit 1015 corrects the offsets of the register 1, register 2, . . . , register n. The control unit 1014 controls the respective registers according to the pattern generated by the pattern generation unit 1013 and the offset values outputted from the offset correction unit 1015.

Next, the operation of the seventh embodiment will be described. A pattern for setting the register unit 1020 is generated by the pattern generation unit 1013, and the register unit 1020 is controlled from the control unit 1014. The method for obtaining the offset values is identical to that described in the fourth embodiment, which is shown in FIG. 7.

The pattern generation unit 1013 generates a pattern, and the control unit 1014 sets the register unit 1020 according to the pattern. In the initial state, the pattern is generated so that the digital input values of the DAC1 and DAC2 are "0" (step 701).

The control unit 1014 reads the values stored in the result outputting register 1080, judges which one of the analog output values from the DAC1 and the DAC2 is smaller, and informs the smaller one as an adjustment DAC to the pattern generation unit 1013 (step 702).

The pattern generation unit 1013 generates a pattern so as to increase the digital input value of the adjustment DAC "1" by "1", and the control unit 1014 sets the register unit 1020 according to the pattern. The comparison result for the outputs of the DAC unit 1030 according to the setting is stored in the result outputting register 1080, and when the control unit 1014 reads the value of the result outputting register 1080 and the comparison result is inverted (step 703), the current digital value of the adjustment DAC is informed as an offset value to the offset correction unit 1015, and then the offset correction unit 1015 stores the offset value (step 704).

At the same time, the control unit 1014 informs the pattern generation unit 1013 that the offset value is obtained, and the pattern generation unit 1013 moves to the operation of starting the comparison. The test based on the comparison is performed as follows. The pattern generation unit 1013 performs a pattern generation, and the control unit 1014 receives the information about the DAC that generates an offset and the offset value from the offset correction unit 1015 according to the pattern, and sets the register unit 1020 after adding the offset value.

The control unit 1014 reads the value of the result outputting register 1080, and judges whether it matches the expected pattern or not (step 705). Thereafter, the state where the measurement cannot be performed when an offset exists is individually inspected, thereby to judge whether the DAC is conforming or not (step 706). Thus, the test for the DACs can be executed without using the CPU.

Thereby, the CPU can perform the test for other circuits such as a main memory mounted on the semiconductor IC, while the control unit performs the test for the DACs.

When the test is executed without performing the offset correction, the offset correction unit can be dispensed with.

As described above, according to the seventh embodiment, the pattern generation unit, the offset correction unit, and the control unit are provided to carry out the test operation that has been performed by the CPU. Therefore, the CPU can perform other operations while the test for the DACs is performed.

APPLICABILITY IN INDUSTRY

As described above, the present invention is useful in simultaneously and speedily judging whether plural DACs are conforming or not, and it can be preferably used for a test of a semiconductor IC including plural DACs.

The invention claimed is:

1. A semiconductor device comprising:
two or more digital-to-analog converters (hereinafter referred to as DACs);
a setting unit which sets digital input values to be input to at least two DACs among the two or more DACs;
a comparison unit which compares the magnitudes of analog output values outputted from the at least two DACs with each other, and outputs a comparison result; and
an offset correction unit which performs a correction that adds offsets to the analog values outputted from the DACs by adding the offsets to the analog output values outputted from the at least two DACs, which correction is performed by changing the digital input which is inputted to one of the DACs or by changing a reference voltage of one of the DACs.

2. A semiconductor device as defined in claim 1 wherein said setting unit comprises
a memory in which a program is stored, and
a CPU which controls the digital input values to be input to the at least two DACs in accordance with the program stored in the memory.

3. A semiconductor device comprising:
two or more digital-to-analog converters (hereinafter referred to as DACs);
a setting unit which sets digital input values to be input to at least two DACs among the two or more DACs;
a comparison unit which compares the magnitudes of analog output values outputted from the at least two DACs with each other, and outputs a comparison result;
an offset correction unit which performs a correction that adds offsets to the analog values outputted from the DACs by adding the offsets to the analog output values outputted from the at least two DACs; and
a judgment unit which judges whether the at least two DACs are conforming or not on the basis of the comparison result.

4. A semiconductor device as defined in claim 1 further including a pattern generation unit which generates a pattern for controlling the digital input values to be input to the at least two DACs.

5. A semiconductor device comprising:
two or more digital-to-analog converters (hereinafter referred to as DACs);
a setting unit which sets digital input values to be input to at least two DACs among the two or more DACs;
a comparison unit which compares the magnitudes of analog output values outputted from the at least two DACs with each other, and outputs a comparison result;
an offset correction unit which performs a correction that adds offsets to the analog values outputted from the DACs by adding the offsets to the analog output values outputted from the at least two DACs; and
an offset correction unit which performs a correction that adds offsets to the digital input values which are to be input to the at least two DACs.

6. A semiconductor device testing apparatus which performs a pass/fail judgment for a semiconductor device having two or more DACs, comprising:
a control unit which controls at least two DACs;
a comparison unit which compares the magnitudes of analog output values outputted from the at least two DACs with each other;
a judgment unit which judges whether the at least two DACs are conforming or not on the basis of the comparison result obtained by the comparison unit; and
said control unit performing a control of alternately one by one increasing or decreasing the digital input values to be input to the two DACs so that an output signal indicating the comparison result for the analog output values outputted from the two DACs has alternately inverted values.

7. A semiconductor device testing apparatus as defined in claim 6 wherein
said comparison unit comprises plural comparators which simultaneously compare the analog output values outputted from the plural pairs of the DACs.

8. A semiconductor device testing apparatus as defined in claim 6 wherein
said comparison unit comprises plural comparators which simultaneously compare the magnitude of the analog output value outputted from one DAC among the at least two DACs, with the magnitudes of the analog output values outputted from the remaining DACs.

9. A semiconductor device testing apparatus as defined in claim 6 wherein
said judgment unit judges whether the at least two DACs are conforming or not on the basis of whether the comparison result obtained by the comparison unit has a predetermined pattern comprising alternately inverted values or not.

10. A method for testing a semiconductor device having two or more DACs, comprising:
a control step of controlling the operations of arbitrary two DACs among the two or more DACs;
a comparison step of comparing the magnitudes of analog output values outputted from the arbitrary two DACs with each other;
a judgment step of judging whether the arbitrary two DACs are conforming or not on the basis of the comparison result obtained in the comparison step; and
said control step performing a control of alternately one by one increasing or decreasing the digital input values to be input to the two DACs so that an output signal indicating the comparison result for the analog output values outputted from the two DACs has alternately inverted values.

11. A method for testing a semiconductor device having two or more DACs, comprising:
a control step of controlling the operations of arbitrary two DACs among the two or more DACs;

a comparison step of comparing the magnitudes of analog output values outputted from the arbitrary two DACs with each other;

a judgment step of judging whether the arbitrary two DACs are conforming or not on the basis of the comparison result obtained in the comparison step; and said judgment step judging whether the two DACs are conforming or not by judging whether the comparison result obtained in the comparison step has alternately inverted values or not.

* * * * *